US006949820B2

(12) United States Patent
Reiss et al.

(10) Patent No.: US 6,949,820 B2
(45) Date of Patent: Sep. 27, 2005

(54) SUBSTRATE-BASED CHIP PACKAGE

(75) Inventors: Martin Reiss, Medingen (DE); Alfred Haimerl, Sinzing (DE); Steffen Kroehnert, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/859,459

(22) Filed: Jun. 2, 2004

(65) Prior Publication Data

US 2005/0006741 A1 Jan. 13, 2005

(30) Foreign Application Priority Data

Jun. 2, 2003 (DE) ........................................ 103 25 029

(51) Int. Cl.[7] ......................... H01L 23/04; H01L 23/12; H01L 23/22; H01L 23/24

(52) U.S. Cl. ........................ 257/698; 257/687; 257/704

(58) Field of Search ................................ 257/678, 687, 257/698, 700, 704

(56) References Cited

U.S. PATENT DOCUMENTS 6,048,755 A 4/2000 Jiang et al.
6,667,560 B2 12/2003 Goh
6,724,076 B1 4/2004 Kahlisch et al.
2002/0030266 A1 * 3/2002 Murata ...................... 257/698

FOREIGN PATENT DOCUMENTS

DE 199 54 888 A1 5/2001
EP 0 810 655 A2 12/1997

* cited by examiner

*Primary Examiner*—Ngân V. Ngô
(74) *Attorney, Agent, or Firm*—Slater & Matsil, L.L.P.

(57) ABSTRACT

The invention relates to a substrate-based chip package, comprising a substrate on which a chip is fastened by a die-attach material. The substrate is provided with a solder resist (on both sides) and, on the side that is opposite from the chip, has conductor tracks which are provided with solder balls and are connected to the chip by means of wire bridges which extend through a bonding channel which is sealed with a glob top. The chip and the substrate on the chip side being encapsulated by a molded cap.

16 Claims, 4 Drawing Sheets

SUBSTRATE-BASED CHIP PACKAGE

TECHNICAL FIELD

The present invention relates generally to device packages, and more particularly to a substrate-based chip package.

BACKGROUND

Substrate-based chip packages are also referred to for example as BGA packages, BGA standing for Ball Grid Array. U.S. Pat. No. 6,048,755, which is incorporated herein by reference, teaches a method for producing a BGA package using a substrate with a patterned solder resist mask.

In the case of such substrate-based chip packages, it is very important that care is taken to protect all the edges of the chip, since cracks or other mechanical damage can also have effects on the active chip side. Such damage may arise in the course of handling, during the back-end process or else with the customer. In order to avoid this, a molded cap (covering material or molding compound), which envelops the rear side of the chip and adjacent regions of the substrate, may be used.

For durable functioning of the chip package, it is of special significance that the covering materials have very good adhesive properties with respect to the surfaces of the different materials of the package. A particular weak point in the package in this case is the solder resist, which for reasons of minimizing warpage is applied on both sides. That is to say, it is also applied on the chip side. Warpage is to be understood as meaning that in a layered structure a distortion of the substrate occurs under the influence of temperature unless layers of different coefficients of expansion are present on both sides, or at least are irregularly distributed.

The solder resist not only absorbs a relatively large amount of moisture (up to about 8%), which is unfavorable for the reliability characteristics of the package, but also significantly reduces the adhesion of the die-attach material and of the molding compound on the substrate base material. In addition, it is also very difficult to harmonize the adhesive properties of the molding-compound and die-attach materials (adhesive) over the entire temperature range (−65° C. to 150° C. in the extreme case). A so-called CTE (coefficient of thermal expansion) mismatch arises, as a result of which the reliability characteristics are significantly reduced.

Furthermore, the moisture content of the solder resist can lead to problems of reliability as a consequence of the higher soldering temperatures due to the use of lead-free solder materials.

The consequence is that the packages may already delaminate, that is come apart, at the molding compound/solder resist, solder resist/substrate and solder resist/die-attach material interfaces during preconditioning.

In order to achieve an improvement in this, the chip is either molded around completely (TSOP), provided with molded caps (for example, BOC with backside protection or BSP) or with other mechanical coverings on the module level. In the case of U.S. Pat. No. 6,048,755, it was attempted to solve the problem at least partly by removing the solder resist under the chip.

In the case of the molded cap, it was attempted to solve the problem by optimizing the adhesive force on the solder resist, which however did not lead to optimum reliability characteristics.

SUMMARY OF THE INVENTION

The preferred embodiment of the invention relates to a substrate-based chip package that includes a substrate on which a chip is fastened by a die-attach material. The substrate is provided with a solder resist (e.g., on both sides) and, on the side that is opposite from the chip, has conductor tracks which are provided with solder balls and are connected to the chip by means of wire bridges. The wire bridges extend through a bonding channel, which is sealed with a glob top. The chip and the substrate on the chip side are encapsulated by a molded cap.

In one aspect, the invention therefore provides a substrate-based chip package of the type stated at the beginning with which the problems mentioned no longer occur and which can be realized at a low cost. In the preferred embodiments, the invention provides a substrate-based chip package where the solder resist on the chip side is cut out at least partially, so that an interface with greater adhesive properties is created at least for the molding compound on the substrate.

A reduction in the moisture absorption and an improvement in the adhesive strength and bending of the molded cap on the substrate is achieved by the invention.

In a variant of the invention, solder resist is arranged between the die-attach material and the substrate, the region under the molding compound being free of-solder resist.

A further refinement of the invention is characterized in that the die-attach material rests directly on the substrate with a greater area extent than the chip and in that the molding compound rests on the solder resist and partly on the die-attach material.

In a special refinement of the invention, the solder resist on the chip side is arranged parallel to two outer edges of the substrate. In this manner, a reduction in the thermally induced bending of the substrate is achieved.

It is particularly advantageous if, in the case of rectangular substrates, the solder resist on the chip side is arranged parallel to the two longer outer edges of the substrate. In this way, a significant reduction in the bending of the substrate is achieved.

BRIEF DESCRIPTION OF THE DRAWINGS

The invention is to be explained in more detail below on the basis of an exemplary embodiment. In the associated drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
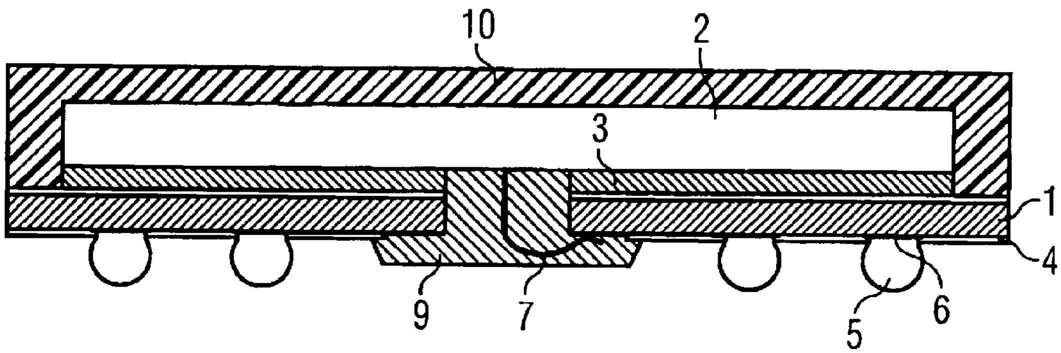
FIG. 1 shows a schematic cross-sectional representation of a chip package according to the invention in which the die-attach material and the molding compound are located directly on the substrate material.
Figure 2:
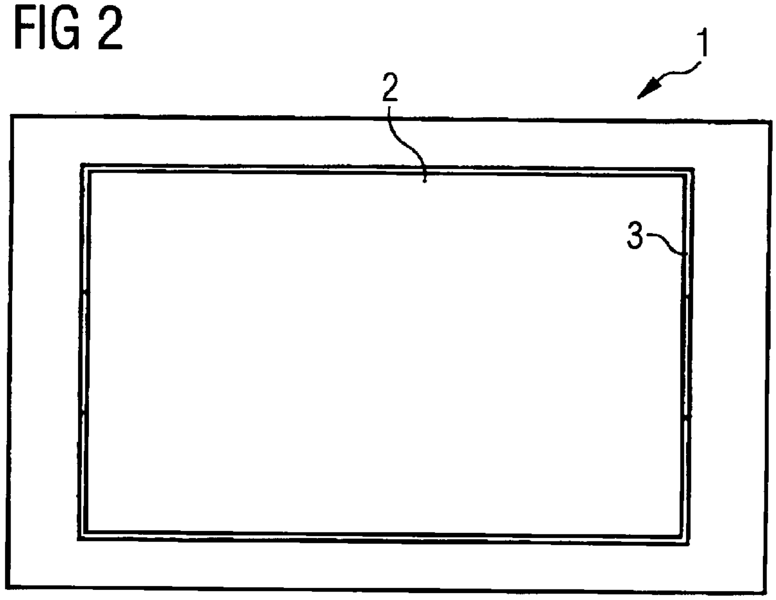
FIG. 2 shows a plan view of the chip package according to FIG. 1.

FIGS. 1 and 2 show a first embodiment of the invention. A substrate-based chip package includes a substrate 1 on which a chip 2 is fastened by a die-attach material 3. In the simplest case, an adhesive, which is printed or dispensed onto the substrate 1 in the chip-mounting region, comes into consideration as the die-attach material 3. The substrate 1 is provided with a solder resist 4 on the side opposite from the chip 2. Also arranged on the side of the substrate 1 that is opposite from the chip 2 are conductor tracks 6 which are provided with solder balls 5 and are connected to the chip 2 by means of wire bridges 7. The wire bridges 7 extend through a bonding channel, which for protection of the wire bridges is filled with a glob top 9. To simplify the representation, only one wire bridge 7 is represented. The chip 2 and the substrate 1 on the chip side are encapsulated by a molded cap 10 to protect the sensitive edges of the chip. The die-attach material 3 and the molded cap 10 surrounding the chip 2 are in this case located directly on the substrate 1.

Figure 3:
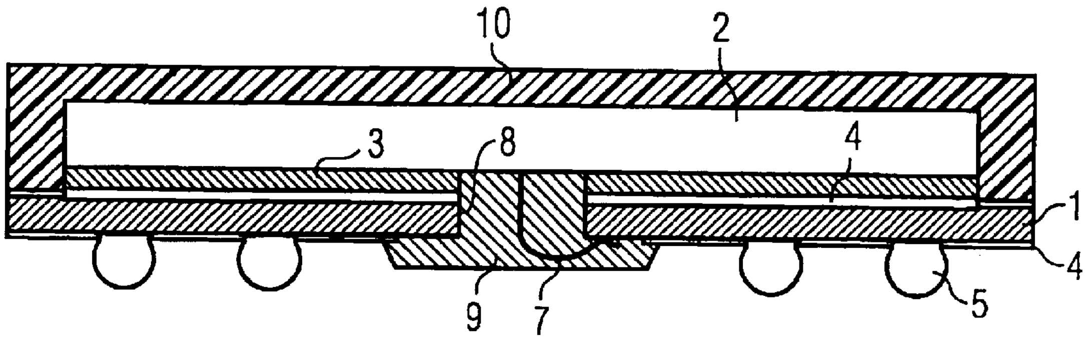
FIG. 3 shows a schematic cross-sectional representation of a chip package according to the invention in which the molding compound is located directly on the substrate material.
Figure 4:
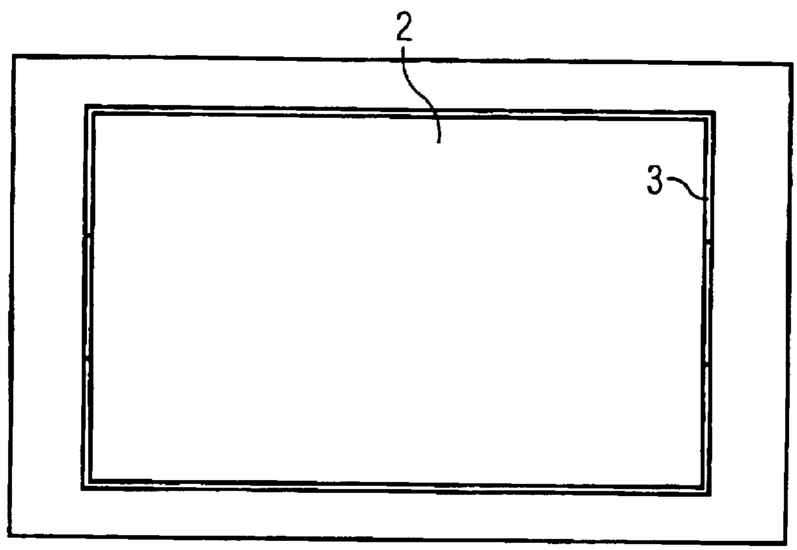
FIG. 4 shows a plan view of the chip package according to FIG. 3.

FIGS. 3 and 4 show a variant of the invention in which the solder resist 4 is arranged under the die-attach material 3 and protrudes slightly beyond it. Here, too, the molded cap 10 surrounding the chip 2 is located substantially directly on the substrate 1.

Figure 5:
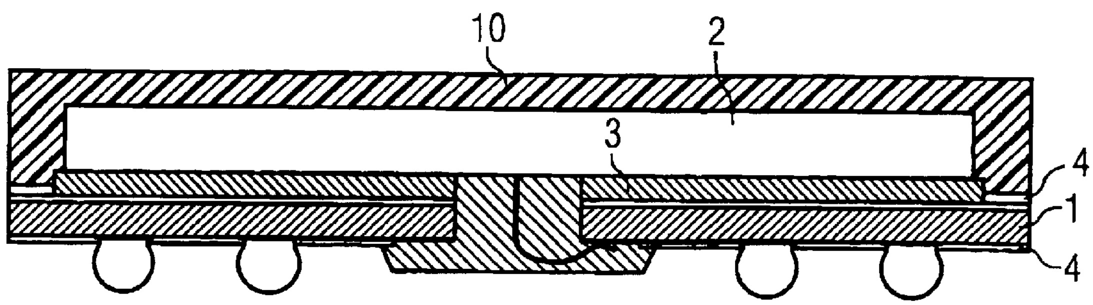
FIG. 5 shows a schematic cross-sectional representation of a chip package according to the invention in which the die-attach material protrudes partly under the molding compound and is surrounded by a strip of solder resist on which the molding compound is located.
Figure 6:
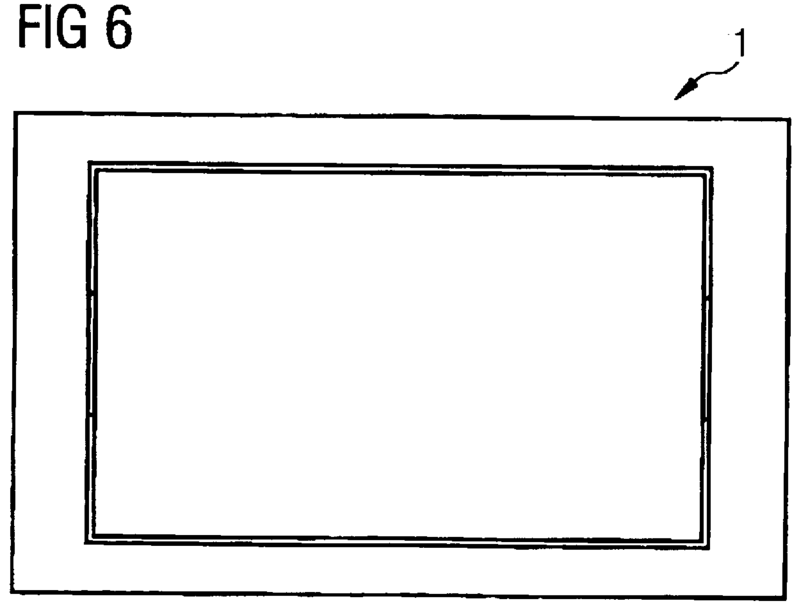
FIG. 6 shows a plan view of the chip package according to FIG. 5.

Represented in FIG. 5 is a further configuration of the invention. In this embodiment, a die-attach material 3, which is located directly on the substrate 1 and is slightly larger than the chip 2 to be mounted (that is to say protrudes slightly into the molded region), is used and in which the region up to the edge of the substrate 1 is provided with solder resist 4, so that the molded cap 10 is located partly on the die-attach material 3, but mainly on the solder resist 4. Here, the solder resist 4 is arranged on the substrate in the edge region of the latter, so that the solder resist 4 completely surrounds the area taken up by the chip 2.

In order to achieve special warpage behavior, however, the solder resist 4 may also be arranged on the chip side of the substrate in such a way that only two strips of solder resist 4 are obtained.

Figure 7:
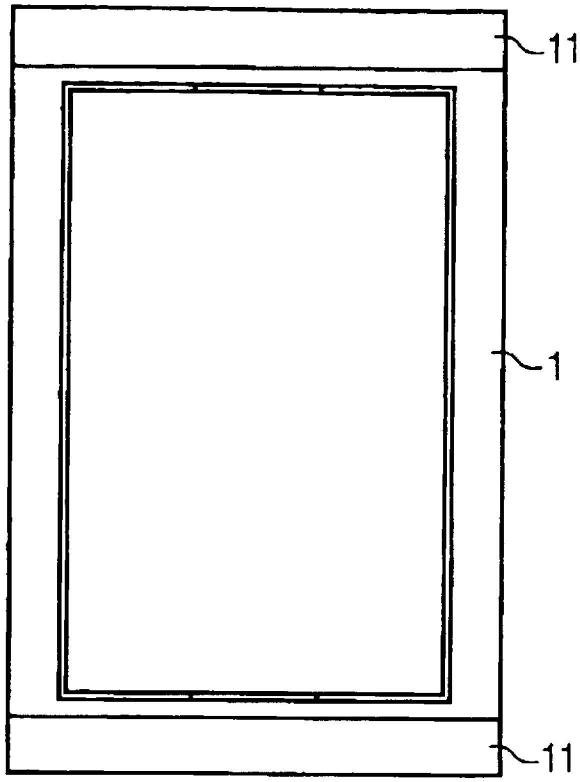
FIG. 7 shows a plan view of a chip package with solder resist strips located in the edge region on the narrow sides.
Figure 8:
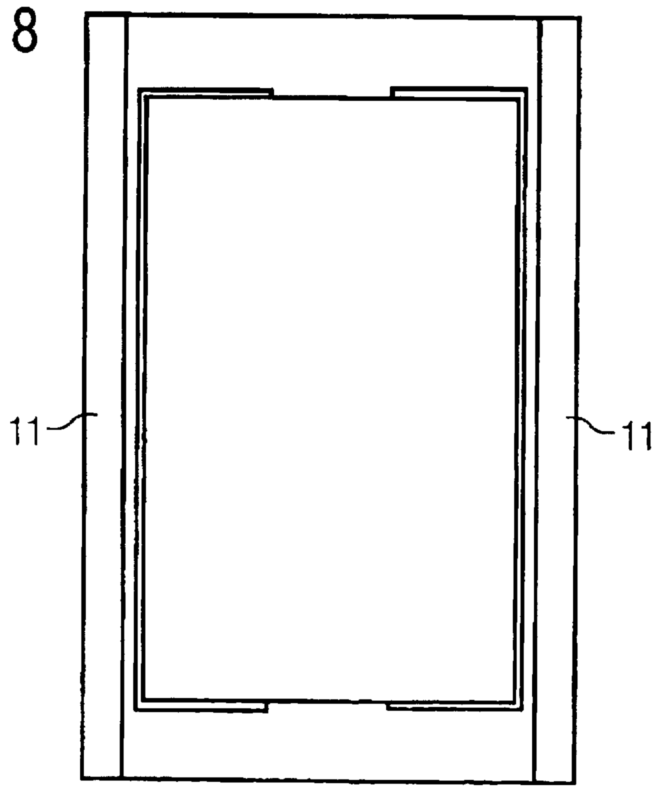
FIG. 8 shows a plan view of a chip package with solder resist strips located in the edge region on the longitudinal sides.

In FIG. 7, two parallel strips 11 of solder resist 4 are arranged on the narrow sides of the substrate and in FIG. 8 two parallel strips 11 of solder resist are arranged along the longitudinal sides.

Although the present invention and its advantages have been described in detail, it should be understood that various changes, substitutions and alterations can be made herein without departing from the spirit and scope of the invention as defined by the appended claims.

What is claimed is:

1. A substrate-based chip package comprising:

a substrate that includes a chip side and an opposite side;

a chip fastened to the substrate by a die-attach material;

a solder resist applied to the substrate at the chip side also at the opposite side, wherein the solder resist on the chip side is patterned so that at least a first portion of the die-attach material is in direct contact with the substrate and so that a second portion of the die-attach material is in contact with the patterned solder resist;

a plurality of solder balls disposed on the opposite side of the substrate;

a plurality of wire bridges extending through a bonding channel in the substrate to electrically couple the chip to the conductor tracks;

a glob top disposed within the bonding channel; and a molding cap encapsulating the chip and the substrate on the chip side.

2. The substrate-based chip package of claim 1, wherein a region between the substrate and the molding compound is free of solder resist.

3. The substrate-based chip package of claim 1, wherein the die-attach material rests directly on the substrate and has with greater outside perimeter than the chip, and wherein the molding compound rests partly on the patterned solder resist and partly on the die-attach material.

4. The substrate-based chip package of claim 1, wherein the patterned solder resist on the chip side is arranged parallel to two outer edges of the substrate.

5. The substrate-based chip package of claim 4, wherein the substrate comprises a rectangular substrate, and wherein the patterned solder resist on the chip side is arranged parallel to two longer outer edges of the substrate.

6. A substrate-based chip package, comprising a substrate on which a chip is fastened by a die-attach material, the substrate being provided with a solder resist on two sides and, on the side that is opposite from the chip, having conductor tracks which are provided with solder balls and are connected to the chip by means of wire bridges which extend through a bonding channel which is sealed with a glob top, and the chip and the substrate on the chip side being encapsulated by a molded cap, wherein the solder resist on the chip side is patterned so that a first portion of the die-attach material directly contacts the chip and the substrate and wherein the die-attach material rests directly on the substrate with a greater outside perimeter than the chip and such that the molding compound rests partly on the patterned solder resist and partly on the die-attach material.

7. The substrate-based chip package according to claim 6, wherein the solder resist on the chip side is arranged parallel to two outer edges of the substrate.

8. The substrate-based chip package according to claim 6, wherein the substrate comprises a rectangular substrate and the solder resist on the chip side is arranged parallel to the two longer outer edges of the substrate.

9. A packaged semiconductor device comprising:

a substrate defining edge portions;

a semiconductor chip overlying a top surface of the substrate;

a die-attach material disposed between the semiconductor chip and the substrate, the die-attach material defining a larger perimeter on the top surface than the semiconductor chip;

a patterned solder resist disposed on the top surface of the substrate, said solder resist extending between the die-attach material and said edge of the substrate, the solder resist adjacent the die-attach material defining an interface; and a molding compound encapsulating a top surface and sidewall surfaces of the semiconductor chip, the molding compound extending over a portion of the die-attach material and the solder resist including over the interface.

10. The device of claim 9 and further comprising:

a plurality of conductive traces disposed on a bottom side of the substrate;

a plurality of solder balls disposed on the bottom side of the substrate, each of the solder balls electrically coupled to one of the conductive traces;

a plurality of bond pads disposed on a surface of the semiconductor chip; and a plurality of wire bridges, each of the wire bridges electrically coupled between one of the bond pads and one of the conductive traces.

11. The device of claim 10, wherein the wire bridges are disposed in a bonding channel that extends through the substrate and wherein the bond pads are located on a central portion of the semiconductor chip.

12. The device of claim 11, and further comprising a glob top disposed within the bonding channel.

13. The device of claim 9, wherein the die-attach material is directly attached to the substrate and also directly attached to the semiconductor chip.

14. The device of claim 9, wherein the solder resist is disposed in two strips along edges of the substrate.

15. The device of claim 14 wherein the substrate comprises a rectangular substrate having long edges and short edges and wherein the solder resist is disposed in two strips along the long edges of the substrate.

16. The device of claim 14, and further comprising solder resist disposed on the bottom side of the substrate.

* * * * *

UNITED STATES PATENT AND TRADEMARK OFFICE

CERTIFICATE OF CORRECTION

PATENT NO. : 6,949,820 B2 
DATED : September 27, 2005
INVENTOR(S) : Reiss et al.

It is certified that error appears in the above-identified patent and that said Letters Patent is hereby corrected as shown below:

Column 3,
Line 61, insert -- and -- between “side” and “also”.

Column 4,
Line 14, delete “with”.

Signed and Sealed this

Sixth Day of December, 2005

JON W. DUDAS
*Director of the United States Patent and Trademark Office*